United States Patent
Gao et al.

(10) Patent No.: US 10,748,989 B2
(45) Date of Patent: Aug. 18, 2020

(54) INSULATING LAYER STRUCTURE FOR SEMICONDUCTOR PRODUCT, AND PREPARATION METHOD OF INSULATING LAYER STRUCTURE

(71) Applicant: Shenyang Silicon Technology Co., Ltd., Shenyang (CN)

(72) Inventors: Wenlin Gao, Beijing (CN); Xiang Li, Fushun (CN); Qingchao Liu, Dandong (CN)

(73) Assignee: Shenyang Silicon Technology Co., Ltd., Shenyang (CN)

(*) Notice: Subject to any disclaimer, the term of this patent is extended or adjusted under 35 U.S.C. 154(b) by 0 days.

(21) Appl. No.: 16/213,002

(22) Filed: Dec. 7, 2018

(65) Prior Publication Data

US 2019/0237540 A1    Aug. 1, 2019

(30) Foreign Application Priority Data

Jan. 26, 2018 (CN) .......................... 2018 1 0075853

(51) Int. Cl.
*H01L 29/06* (2006.01)
*H01L 21/762* (2006.01)
*H01L 21/02* (2006.01)
*H01L 21/322* (2006.01)
(Continued)

(52) U.S. Cl.
CPC ........ *H01L 29/0649* (2013.01); *H01L 21/022* (2013.01); *H01L 21/0234* (2013.01); *H01L 21/02054* (2013.01); *H01L 21/02301* (2013.01); *H01L 21/02334* (2013.01); *H01L 21/3226* (2013.01); *H01L 21/76251* (2013.01); *H01L 21/76254* (2013.01); *H01L 23/585* (2013.01); *H01L 23/66* (2013.01)

(58) Field of Classification Search
CPC .............. H01L 21/022; H01L 21/3226; H01L 21/76251; H01L 23/585; H01L 23/66; H01L 27/1203; H01L 29/0649
See application file for complete search history.

(56) References Cited

U.S. PATENT DOCUMENTS 6,774,435 B1 * 8/2004 Matsumoto ......... H01L 21/3226
                                                        257/347
2002/0089016 A1 * 7/2002 Joly .................. H01L 21/76251
                                                        257/349
(Continued)

*Primary Examiner* — Allan R Wilson
(74) *Attorney, Agent, or Firm* — Maier & Maier, PLLC

(57) ABSTRACT

An insulating layer structure for a semiconductor product. The insulating layer structure includes a device substrate, a supporting substrate and a thin film layer. The device substrate and the supporting substrate are silicon wafers. The thin film layer(s) is/are arranged on the device substrate or/and the supporting substrate. The device substrate and the supporting substrate are bonded together through the thin film layer arranged on at least one of the device substrate and the supporting substrate to form an integral multilayer SOI structure. The insulating layer structure formed by the present invention solves problems of serious spontaneous heating of an existing SOI device, severe warpage of an existing SOI structure caused by high-temperature annealing, a poor radio frequency characteristic and the like, and has a predictable relatively higher economic and social value.

10 Claims, 3 Drawing Sheets

(51) Int. Cl.
*H01L 23/58* (2006.01)
*H01L 23/66* (2006.01)

(56) References Cited

U.S. PATENT DOCUMENTS

2008/0242051 A1* 10/2008 Yamazaki ......... H01L 21/76254
438/458
2019/0035881 A1* 1/2019 Kweskin ............... H01L 21/324

* cited by examiner

INSULATING LAYER STRUCTURE FOR SEMICONDUCTOR PRODUCT, AND PREPARATION METHOD OF INSULATING LAYER STRUCTURE

FIELD

The present invention relates to the technical field of semiconductor material preparation, and more particularly, to an insulating layer structure for a semiconductor product and a preparation method of the insulating layer structure which is formed through a bonding process.

BACKGROUND

In the prior art, a device with an SOI (Silicon On Insulator) structure can reduce junction capacitance and leakage current, increase a switching speed and reduce a power consumption substantially due to the unique superiority of the SOI structure, and thus realizes high-speed and low-power consuming operation. Therefore, the performance of this device is significantly better than a bulk silicon device and circuit. Currently, the application of the SOI device has gradually expanded from military, aerospace and industrial to the fields of data processing, communications, consumer electronics and the like. The SOI technology, as a next-generation silicon-based integrated circuit technology, is not only widely used in most fields of microelectronics, but also used in other fields such as optoelectronics and MEMS. Thus, the SOI technology has become a research hotspot because of the above advantages and wide applications, and is known as "the silicon integrated circuit technology in the 21st century".

SOI materials also have the following limitations although they can be successfully applied to high-speed and low-power consuming IC products.

(1) There are still limitations in the application of high-temperature and high-power devices (such as automobiles, household appliances, power facilities, and the like). One of the main problems is the spontaneous heating effect, namely an overheating failure of the device caused by poorer thermal conductivity of the insulating $SiO_2$ layer (its thermal conductivity is only about 1% of that of silicon).

(2) A conventional SOI device is poor in circuit performance at a high frequency due to the existence of parasitic capacitance and leakage current, and is difficult to achieve better RF performance even if a substrate resistivity is increased.

Therefore, it is desired to obtain an insulating layer structure for a semiconductor product and a preparation method of the insulating layer structure which is excellent in a technical effect.

SUMMARY

An object of the present invention is to provide an insulating layer structure for a semiconductor product and a preparation method of the insulating layer structure excellent in technical effects.

An insulating layer structure for a semiconductor product provided by the present invention comprises a device substrate 1, a supporting substrate 2 and a thin film layer 3, wherein the device substrate 1 and the supporting substrate 2 are silicon wafers; and the thin film layer(s) 3 is/are arranged on the device substrate 1 or/and the supporting substrate 2, and is/are one of a silicon dioxide layer, a silicon oxynitride layer, a silicon nitride layer, a polysilicon layer and an amorphous silicon layer.

The device substrate 1 and the supporting substrate 2 are bonded together through the thin film layer 3 arranged on at least one of the device substrate 1 and the supporting substrate 2 to form an integral multilayer SOI (Silicon On Insulator) structure.

The preferable protection contents of the insulating layer structure for the semiconductor product are as follows.

At least one intermediate layer 4 is arranged on the thin film layer 3 on at least one of the device substrate 1 and the supporting substrate 2, and is one or a combination of the followings: a silicon dioxide layer, a silicon oxynitride layer, a silicon nitride layer, a polysilicon layer and an amorphous silicon layer.

An intermediate layer 4 is arranged on the thin film layer 3 on at least one of the device substrate 1 and the supporting substrate 2; and the device substrate 1 and the supporting substrate 2 are bonded together through the thin film layer 3 arranged on at least one of the device substrate 1 and the supporting substrate 2 and the intermediate layer 4 on the thin film layer 3 to form an integral multilayer SOI structure.

The insulating layer structure for the semiconductor product meets one or a combination of the following requirements:

first, the resistivity of a silicon wafer used as the device substrate 1 or/and the supporting substrate 2 is 0.1-10000 ohm·cm;

second, when the thin film layer 3 or the intermediate layer 4 is silicon dioxide layer, the thickness of the silicon dioxide layer is 0-5 μm, the single layer thickness of following layer structures, comprising the silicon oxynitride layer, the silicon nitride layer, the polysilicon layer and the amorphous silicon layer, as the thin film layer 3 or the intermediate layer 4 is 0.01-10 μm;

third, the diameter of the silicon wafer is 150 mm, or 200 mm, or 300 mm; and fourth, the thin film layer(s) 3 arranged on the device substrate 1 or/and the supporting substrate 2 and the intermediate layer(s) 4 arranged on the thin film layer(s) are bonded together to form the integral multilayer SOI structure.

The present invention also relates to a preparation method of an insulating layer structure for a semiconductor product. Requirements of the preparation method are as follows.

First, a device substrate 1 and a supporting substrate 2 of an insulating layer structure for a semiconductor product are prepared; and a thin film layer 3 on at least one of the surfaces of the device substrate 1 and the supporting substrate 2 is prepared. The device substrate 1 and the supporting substrate 2 are silicon wafers. The thin film layer(s) 3 is/are arranged on the device substrate 1 or/and the supporting substrate 2, and is/are one of a silicon dioxide layer, a silicon oxynitride layer, a silicon nitride layer, a polysilicon layer and an amorphous silicon layer.

Second, the device substrate 1 and the supporting substrate 2 are bonded through the thin film layer 3 arranged on at least one of the device substrate 1 and the supporting substrate 2 to form an integral multilayer SOI structure.

The preparation method of the insulating layer structure for the semiconductor product is characterized in that before bonding, at least one intermediate layer 4 is pre-arranged on the thin film layer 3 of at least one of the device substrate 1 and the supporting substrate 2, and is one or a combination of the followings: the silicon dioxide layer, the silicon oxynitride layer, the silicon nitride layer, the polysilicon layer and the amorphous silicon layer.

The bonding meets the following requirements: the thin film layer 3 and the intermediate layer 4 are sequentially arranged on a base body of at least one of the device substrate 1 and the supporting substrate 2 before bonding; and the other one of the device substrate 1 and the supporting substrate 2 to be bonded is a base body without the thin film layer 3 or the intermediate layer 4, or a base body only provided with the thin film layer 3, or a base body sequentially provided with the thin film layer 3 and the intermediate layer 4.

The preparation method of the insulating layer structure for the semiconductor product is characterized in that the selected device substrate 1 and supporting substrate 2 before bonding are silicon wafers with the resistivity of 0.1-10000 ohm·cm;

when the thin film layer 3 is the silicon dioxide layer, the thickness of the silicon dioxide layer is 0-5 μm;

when at least one intermediate layer 4 is arranged on the thin film layer(s) 3 on the device substrate 1 or/and the supporting substrate 2, the single layer thickness of the intermediate layer 4 is 0.01-10 μm; and the single intermediate layer 4 is one of the silicon oxynitride layer, the silicon nitride layer, the polysilicon layer and the amorphous silicon layer.

The diameter of the silicon wafer is 150 mm, or 200 mm, or 300 mm.

The thin film layer(s) 3 arranged on the device substrate 1 or/and the supporting substrate 2 and the intermediate layer(s) 4 on the thin film layer(s) 3 are bonded together to form the integral multilayer SOI structure.

The preferable steps of the preparation method of the insulating layer structure for the semiconductor product are as follows.

First, a silicon wafer with any crystal phase, any conductivity type, the diameter of 150 mm, or 200 mm or 300 mm, and the resistivity of 0.1-10000 ohm·cm is selected as the device substrate 1 and the supporting substrate 2.

Second, the device substrate 1 and the supporting substrate 2 are ultrasonically cleaned successively by using a mixed solution of HF, $H_2SO_4$ and $H_2O_2$ and deionized water to remove a natural oxide layer and contaminants on the surfaces of the device substrate 1 and the supporting substrate 2 to obtain the silicon wafers with high-quality surfaces; the device substrate 1 and the supporting substrate 2 are spin-dried after the completion of cleaning; and the device substrate 1 and/or the supporting substrate 2 to be grown with a thin film layer 3 are/is placed into a reaction chamber of a PECVD or LPCVD apparatus.

Third, plasma in-situ cleaning is performed on the device substrate 1 and/or the supporting substrate 2 with a hydrogen flow rate of 20-200 sccm and a cleaning time of 5-20 min.

Fourth, the thin film layer 3 is deposited on a base body of at least one of the device substrate 1 and the supporting substrate 2, wherein according to different materials of the thin film layers 3, gases used in deposition are oxygen, hydrogen, nitrogen, silane, nitrous oxide, hydrogen and argon with flow rates of 0-20 slm, 0-10 slm, 0-1 slm, 0-25 sccm, 0-20 sccm, 0-50 sccm and 0-60 sccm respectively; a deposition pressure is 0-10 Pa; the deposition thickness of a silicon dioxide layer as the thin film layer 3 is 0-5 μm; and a deposition thickness of a silicon oxynitride layer, a silicon nitride layer, a polysilicon layer or an amorphous silicon layer as the thin film layer 3 is 0-10 μm.

Fifth, plasma in-situ cleaning is performed on the device substrate 1 and/or the supporting substrate 2 with a hydrogen flow rate of 20-200 sccm and a cleaning time of 5-20 min.

Sixth, an intermediate layer 4 is deposited on the surface of the thin film layer 3 on the device substrate 1 and/or the supporting substrate 2, wherein according to different materials of the intermediate layer 4, gases used in deposition are silane, nitrous oxide, hydrogen, argon and ammonia with the flow rates of 5-25 sccm, 2-20 sccm, 10-50 sccm, 30-60 sccm and 5-20 sccm respectively; a deposition pressure is 5-10 Pa; and the deposition thickness is 0.01-10 μm.

Seventh, hydrogen plasma etching is performed after the intermediate layer 4 as the thin film layer is deposited with a hydrogen flow rate of 30-120 sccm and an etching time of 0.5-10 min.

Eighth, another intermediate layer 4 is deposited on the surface of the single intermediate layer 4 prepared in the above steps, and this step is repeated for n (n≥0) times till the total deposition thickness meets a requirement.

Ninth, the device substrate 1 and/or the supporting substrate 2 processed by the above steps are/is processed through a manner I or II to obtain an SOI material with a special insulating buried layer, wherein the manner I comprises: performing low-temperature vacuum bonding on the device substrate 1 and the supporting substrate 2, and grinding and polishing a bonded sheet obtained in the above step to obtain the SOI material having a top silicon thickness of 1.5-250 μm; and the manner II comprises: injecting hydrogen ions into the device substrate 1 with an injection depth of 100-1500 nm, performing low-temperature vacuum bonding on the device substrate 1 and the supporting substrate 2 to obtain a bonded sheet, performing low-temperature annealing process on the bonded sheet with an annealing temperature of 150-300° C., performing microwave splitting or laser splitting on this bonded sheet to form an SOI structure material, and performing CMP process on the SOI structure to form the SOI material having a top layer thickness of 0.02-1.5 μm.

The microwave splitting has the following requirements: a microwave power is 1-4 KW; a microwave time is 2-5 min; and a microwave temperature is 70-400° C. The laser splitting has the following requirements: an infrared laser is adopted; a laser spot size is 0.5-2 mm; a laser power is 100 mw-100 w; a heating time is 10-30 s; a laser scanning path is along the diameter direction of the silicon wafer; the scanning number of the silicon wafer is 8-28 times; a laser beam scans the silicon wafer at an incident angle of 45°-135°; and the surface temperature of the silicon wafer increases quickly through laser heating to enable hydrogen ions in the silicon wafer to accumulate to achieve the purpose of splitting.

The preparation method of the insulating layer structure for the semiconductor product meets one or a combination of the following requirements. First, in the process of depositing the intermediate layer 4, a hydrogen plasma etching step is added, so that a weak Si—N bond is broken while filling a silicon dangling bond through an etching effect of hydrogen plasma, and a new stable Si—N bond is re-formed. Meanwhile, a surface activity of the thin film is increased and nucleation energy is reduced to prepare a high-quality silicon nitride film as the intermediate layer 4.

Second, an SOI warpage change caused by the difference in thermal expansion coefficients after high-temperature annealing is reduced by adjusting thicknesses of the silicon oxynitride film and the silicon nitride film in the intermediate layer 4.

In the laser splitting process, laser acts on the surface of the silicon wafer to heat the surface of the silicon wafer, so that injected H+ is accumulated into gas molecules which are filled in cracks subsequently to form micro hydrogen bubbles; and with the continuous accumulation of the hydrogen molecules, a hydrogen layer is finally peeled off to achieve the purpose of splitting, and thus an SOI structure is formed. Compared with the microwave splitting technology, the laser heating splitting has the following advantages that a lattice defect and a metal inclusion brought by the hydrogen ion injection layer are eliminated, a surface adsorption material is removed, and the surface roughness is improved.

The above supplemental instructions are as follows.

The problem of the limitation of the SOI material in the prior art can be solved by changing the structure of the insulating layer.

(1) The $SiO_2$ film in the insulating layer is replaced with a silicon nitride film or a silicon oxynitride film. The silicon nitride film or the silicon oxynitride film has the potential to become a material that can replace $SiO_2$ as the insulating buried layer and can realize industrialization by virtue of a high thermal conductivity, an excellent insulativity, a high dielectric constant, a high heat dissipation coefficient, a compact structure, stable chemical properties, a simple preparation process, a high process compatibility, low cost, and the like.

(2) The $SiO_2$ layer in the insulating layer is replaced with a polysilicon film or an amorphous silicon film which can effectively combine with silicon oxide to effectively suppress surface parasitic conductance of the silicon substrate, limit capacitance change and reduce power of generated harmonics. Therefore, the radio frequency characteristic is improved.

(3) A silicon nitride film deposited through the conventional LPCVD/PECVD method contains many defects such as dislocations, surface states and dangling bonds, which greatly reduces the quality of the silicon nitride film. In the process of depositing the intermediate layer 4, a hydrogen plasma etching step is added, so that a weak Si—N bond is broken while filling a silicon dangling bond through an etching effect of hydrogen plasma, and a new stable Si—N bond is re-formed. Meanwhile, a surface activity of the thin film is increased and nucleation energy is reduced to prepare a high-quality silicon nitride film as the intermediate layer 4. In addition, an SOI warpage change caused by the difference in thermal expansion coefficients after high-temperature annealing is reduced by adjusting thicknesses of the silicon oxynitride film and the silicon nitride film in the intermediate layer 4.

(4) The laser splitting method mentioned in the present invention is advantageous for the preparation of the high-quality SOI. Laser acts on the surface of the silicon wafer to heat the surface of the silicon wafer, so that injected H+ is accumulated into gas molecules which are filled in cracks subsequently to form micro hydrogen bubbles; and with the continuous accumulation of the hydrogen molecules, a hydrogen layer is finally peeled off to achieve the purpose of splitting, and thus an SOI structure is formed. Compared with the microwave splitting technology, the laser heating splitting has the following advantages that a lattice defect and a metal inclusion brought by the hydrogen ion injection layer are eliminated, a surface adsorption material is removed, and the surface roughness is improved.

The present invention adopts a bonding process to form a special insulating layer structure which is diverse and meets the design requirements of MEMS, radio frequency and optical devices.

The structure prepared by the present invention is diverse. Particularly, the diversity of the structure is shown in the embodiments. This diversity of the multilayer structure can meet the design requirements of various devices and has great technical advantages.

The present invention has the following advantages.

1. The method provided by the present invention forms the special insulating layer structure through the bonding process. In this structure, through the bonding process, a silicon oxynitride layer, a silicon nitride layer, a silicon dioxide layer or a polysilicon layer which is formed on the silicon wafer by using a method such as LPCVD/PECVD is combined with a silicon wafer and a silicon dioxide wafer, a silicon oxynitride wafer, a silicon nitride wafer, a polysilicon wafer, or an amorphous silicon wafer to form a multilayer SOI structure.

2. The structure formed by the method of the present invention is diverse and can meet design requirements of different devices.

3. One of the innovations in the technical solution of the present invention is that the silicon nitride layer or the silicon oxynitride layer is used to replace the silicon dioxide layer as the insulating layer, so that the problem of serious spontaneous heating of an existing SOI device using the silicon dioxide film as the insulating buried layer is solved.

4. The method of the present invention also creatively uses polysilicon or amorphous silicon to replace silicon dioxide as the insulating layer material, so that the problem of a poor radio frequency characteristic of the existing SOI device using the silicon dioxide film as the insulating buried layer is solved.

5. The preparation process of the insulating layer material used in the method of the present invention is simple, high in process compatibility and low in cost.

6. The insulating layer material used in the method of the present invention has a high selectivity and can serve as a thermal corrosion and acid corrosion barrier layer.

7. The SOI material with the excellent thermal conductivity is prepared by the method of the present invention, so that the problems of serious spontaneous heating of an existing SOI device which uses the $SiO_2$ film as the insulating buried layer, and severe warpage of this SOI caused by high-temperature annealing are solved. Meanwhile, with the introduction of the laser splitting technology, layer density defects of the device are reduced, so that the production efficiency and the product quality are improved.

In summary, the insulating layer structure provided by the present invention has a predictable relatively higher economic and social value.

DETAILED DESCRIPTION

Embodiment 1

Figure 1:
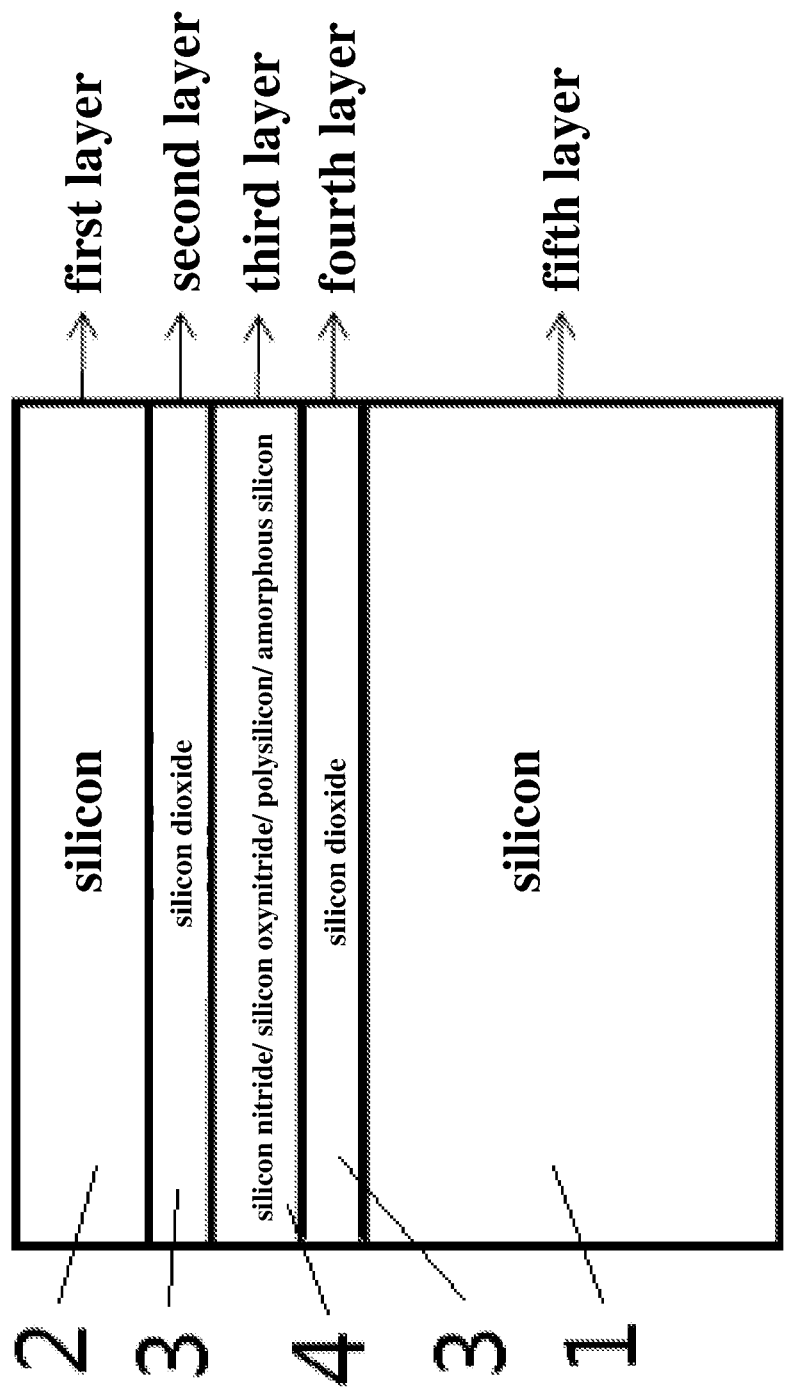
FIG. 1 is a schematic view of an insulating layer structure for a semiconductor product according to Embodiment 1.

An insulating layer structure for a semiconductor product comprises a device substrate 1, a supporting substrate 2 and a thin film layer 3, wherein the device substrate 1 and the supporting substrate 2 are silicon wafers; and the thin film layer(s) 3 is/are arranged on the device substrate 1 or/and the supporting substrate 2, and is/are one of a silicon dioxide layer, a silicon oxynitride layer, a silicon nitride layer, a polysilicon layer and an amorphous silicon layer.

The device substrate 1 and the supporting substrate 2 are bonded together through the thin film layer 3 arranged on at least one of the device substrate 1 and the supporting substrate 2 to form an integral multilayer SOI (Silicon On Insulator) structure.

The insulating layer structure for the semiconductor product meets a combination of the following requirements:

first, the resistivity of a silicon wafer used as the device substrate 1 or/and the supporting substrate 2 is 0.1-10000 ohm·cm;

second, when the thin film layer 3 or the intermediate layer 4 is silicon dioxide layer, the thickness of the silicon dioxide layer is 0-5 μm, the single layer thickness of following layer structures, comprising a silicon oxynitride layer, a silicon nitride layer, a polysilicon layer and an amorphous silicon layer, as the thin film layer 3 or the intermediate layer 4 is 0.01-10 μm;

third, the diameter of the silicon wafer is 150 mm, or 200 mm, or 300 mm; and fourth, the thin film layer(s) 3 arranged on the device substrate 1 and the supporting substrate 2 and the intermediate layer(s) 4 arranged on the thin film layer(s) are bonded together to form an integral multilayer SOI structure.

The present invention also relates to a preparation method of an insulating layer structure for a semiconductor product. Requirements of the preparation method are as follows.

First, a device substrate 1 and a supporting substrate 2 of an insulating layer structure for a semiconductor product are prepared; and a thin film layer 3 is prepared on at least one of the surfaces of the device substrate 1 and the supporting substrate 2. The device substrate 1 and the supporting substrate 2 are silicon wafers. The thin film layer(s) 3 is/are arranged on the device substrate 1 or/and the supporting substrate 2, and is/are one of a silicon dioxide layer, a silicon oxynitride layer, a silicon nitride layer, a polysilicon layer and an amorphous silicon layer.

Second, the device substrate 1 and the supporting substrate 2 are bonded through the thin film layer 3 arranged on at least one of the device substrate 1 and the supporting substrate 2 to form an integral multilayer SOI structure.

At least one intermediate layer 4 is pre-arranged on the thin film layer 3 on at least one of the device substrate 1 and the supporting substrate 2 before bonding, and is one or a combination of the followings: the silicon dioxide layer, the silicon oxynitride layer, the silicon nitride layer, the polysilicon layer and the amorphous silicon layer.

The bonding meets the following requirements: the thin film layer 3 and the intermediate layer 4 are sequentially arranged on a base body of at least one of the device substrate 1 and the supporting substrate 2 before bonding; and the other one of the device substrate 1 and the supporting substrate 2 to be bonded is a base body without the thin film layer 3 and the intermediate layer 4, or a base body only provided with the thin film layer 3, or a base body sequentially provided with the thin film layer 3 and the intermediate layer 4.

The selected device substrate 1 and supporting substrate 2 before bonding are silicon wafers with the resistivity of 0.1-10000 ohm·cm.

When the thin film layer 3 is the silicon dioxide layer, the thickness of the silicon dioxide layer is 0-5 μm.

When at least one intermediate layer 4 is arranged on the thin film layer(s) 3 on the device substrate 1 and/or the supporting substrate 2, the single layer thickness of the intermediate layer 4 is 0.01-10 μm; and the single intermediate layer 4 is one of the silicon oxynitride layer, the silicon nitride layer, the polysilicon layer and the amorphous silicon layer.

The diameter of the silicon wafer is 150 mm, or 200 mm, or 300 mm.

The thin film layer(s) 3 arranged on the device substrate 1 or/and the supporting substrate 2 and the intermediate layer(s) 4 on the thin film layer(s) 3 are bonded together to form the integral multilayer SOI structure.

The particular steps of the preparation method of the insulating layer structure for the semiconductor product are as follows.

First, a silicon wafer with any crystal phase, any conductivity type, the diameter of 150 mm, or 200 mm or 300 mm, and the resistivity of 0.1-10000 ohm·cm is selected as the device substrate 1 and the supporting substrate 2.

Second, the device substrate 1 and the supporting substrate 2 are ultrasonically cleaned successively by using a mixed solution of HF, $H_2SO_4$ and $H_2O_2$ and deionized water to remove a natural oxide layer and contaminants on the surfaces of the device substrate 1 and the supporting substrate 2 to obtain the silicon wafers with high-quality surfaces; the device substrate 1 and the supporting substrate 2 are spin-dried after the completion of cleaning; and the device substrate 1 and/or the supporting substrate 2 to be grown with a thin film layer 3 are/is placed into a reaction chamber of a PECVD or LPCVD apparatus.

Third, plasma in-situ cleaning is performed on the device substrate 1 and/or the supporting substrate 2 with a hydrogen flow rate of 20-200 sccm and a cleaning time of 5-20 min.

Fourth, the thin film layer 3 is deposited on a base body of at least one of the device substrate 1 and the supporting substrate 2, wherein according to different materials of the thin film layers 3, gases used in deposition are oxygen, hydrogen, nitrogen, silane, nitrous oxide, hydrogen and argon with flow rates of 0-20 slm, 0-10 slm, 0-1 slm, 0-25 sccm, 0-20 sccm, 0-50 sccm and 0-60 sccm respectively; a deposition pressure is 0-10 Pa; the deposition thickness of a silicon dioxide layer as the thin film layer 3 is 0-5 μm; and a deposition thickness of a silicon oxynitride layer, a silicon nitride layer, a polysilicon layer or an amorphous silicon layer as the thin film layer 3 is 0-10 μm.

Fifth, plasma in-situ cleaning is performed on the device substrate 1 and/or the supporting substrate 2 with a hydrogen flow rate of 20-200 sccm and a cleaning time of 5-20 min.

Sixth, an intermediate layer 4 is deposited on the surfaces of the thin film layer 3 on the device substrate 1 and/or the supporting substrate 2, wherein according to different materials of the intermediate layer 4, gases used in deposition are silane, nitrous oxide, hydrogen, argon and ammonia with the flow rates of 5-25 sccm, 2-20 sccm, 10-50 sccm, 30-60 sccm and 5-20 sccm respectively; a deposition pressure is 5-10 Pa; and the deposition thickness is 0.01-10 μm.

Seventh, hydrogen plasma etching is performed after the intermediate layer 4 as the thin film layer is deposited with a hydrogen flow rate of 30-120 sccm and an etching time of 0.5-10 min.

Eighth, another intermediate layer 4 is deposited on the surface of the single intermediate layer 4 prepared in the above steps, and this step is repeated for n (n≥0 and is an integer) times till the total deposition thickness meets a requirement.

Ninth, the device substrate 1 and/or the supporting substrate 2 processed by the above steps are/is processed through a manner I or II to obtain an SOI material with a special insulating buried layer, wherein the manner I comprises: performing low-temperature vacuum bonding on the device substrate 1 and the supporting substrate 2, and grinding and polishing a bonded sheet obtained in the above step to obtain the SOI material having a top silicon thickness of 1.5-250 μm.

The manner II comprises: injecting hydrogen ions into the device substrate 1 with an injection depth of 100-1500 nm, performing low-temperature vacuum bonding on the device substrate 1 and the supporting substrate 2 to obtain a bonded sheet, performing low-temperature annealing process on the bonded sheet with an annealing temperature of 150-300° C., performing microwave splitting or laser splitting on this bonded sheet to form an SOI structure material, and performing CMP process on the SOI structure to form the SOI material having a top layer thickness of 0.02-1.5 μm.

The microwave splitting has the following requirements: a microwave power is 1-4 KW; a microwave time is 2-5 min; and a microwave temperature is 70-400° C. The laser splitting has the following requirements: an infrared laser is adopted; a laser spot size is 0.5-2 mm; a laser power is 100 mw-100 w; a heating time is 10-30 s; a laser scanning path is along the diameter direction of the silicon wafer; the scanning number of the silicon wafer is 8-28 times; a laser beam scans the silicon wafer at an incident angle of 45°-135°; and the surface temperature of the silicon wafer increases quickly through laser heating to enable hydrogen ions in the silicon wafer to accumulate to achieve the purpose of splitting.

The preparation method of the insulating layer structure for the semiconductor product meets a combination of the following requirements:

First, in the process of depositing the intermediate layer 4, a hydrogen plasma etching step is added, so that a weak Si—N bond is broken while filling a silicon dangling bond through an etching effect of hydrogen plasma, and a new stable Si—N bond is re-formed. Meanwhile, a surface activity of the thin film is increased and nucleation energy is reduced to prepare a high-quality silicon nitride film as the intermediate layer 4.

Second, an SOI warpage change caused by the difference in thermal expansion coefficients after high-temperature annealing is reduced by adjusting thicknesses of the silicon oxynitride film and the silicon nitride film in the intermediate layer 4.

In the laser splitting process, laser acts on the surface of the silicon wafer to heat the surface of the silicon wafer, so that injected H+ is accumulated into gas molecules which are filled in cracks subsequently to form micro hydrogen bubbles; and with the continuous accumulation of the hydrogen molecules, a hydrogen layer is finally peeled off to achieve the purpose of splitting, and thus an SOI structure is formed. Compared with the microwave splitting technology, the laser heating splitting has the following advantages that a lattice defect and a metal inclusion brought by the hydrogen ion injection layer are eliminated, a surface adsorption material is removed, and the surface roughness is improved.

The above supplemental instructions are as follows.

The problem of the limitations of the SOI material in the prior art can be solved by changing the structure of the insulating layer.

(1) The $SiO_2$ film in the insulating layer is replaced with a silicon nitride film or a silicon oxynitride film. The silicon nitride film or a silicon oxynitride film has the potential to become a material that can replace $SiO_2$ as the insulating buried layer and can realize industrialization by virtue of a high thermal conductivity, an excellent insulativity, a high dielectric constant, a high heat dissipation coefficient, a compact structure, stable chemical properties, a simple preparation process, a high process compatibility, low cost, and the like.

(2) The $SiO_2$ layer in the insulating layer is replaced with a polysilicon film or an amorphous silicon film which can effectively combine with silicon oxide to effectively suppress surface parasitic conductance of the silicon substrate, limit capacitance change and reduce power of generated harmonics. Therefore, radio frequency characteristics are improved.

(3) A silicon nitride film deposited through the conventional LPCVD/PECVD method contains many defects such as dislocations, surface states and dangling bonds, which greatly reduces the quality of the silicon nitride film. In the process of depositing the intermediate layer 4 in this embodiment, a hydrogen plasma etching step is added, so that a weak Si—N bond is broken while filling a silicon dangling bond through an etching effect of hydrogen plasma, and a new stable Si—N bond is re-formed. Meanwhile, a surface activity of the thin film is increased and nucleation energy is reduced to prepare a high-quality silicon nitride film as the intermediate layer 4. In addition, an SOI warpage change caused by the difference in thermal expansion coefficients after high-temperature annealing is reduced by adjusting thicknesses of the silicon oxynitride film and the silicon nitride film in the intermediate layer 4.

(4) The laser splitting method mentioned in this embodiment is advantageous for the preparation of the high-quality SOI. Laser acts on the surface of the silicon wafer to heat the surface of the silicon wafer, so that injected H+ is accumulated into gas molecules which are filled in cracks subsequently to form micro hydrogen bubbles; and with the continuous accumulation of the hydrogen molecules, a hydrogen layer is finally peeled off to achieve the purpose of splitting, and thus an SOI structure is formed. Compared with the microwave splitting technology, the laser heating splitting has the following advantages that a lattice defect and a metal inclusion brought by the hydrogen ion injection layer are eliminated, a surface adsorption material is removed, and the surface roughness is improved.

The present embodiment adopts a bonding process to form a special insulating layer structure which is diverse and meets the design requirements of MEMS, radio frequency and optical devices.

The structure prepared by the present invention is diverse. Particularly, the diversity of the structure is shown in the embodiments. This diversity of the multilayer structure can meet the design requirements of various devices and has great technical advantages.

The present embodiment has the advantages as follows.

1. The method provided by the present embodiment forms the special insulating layer structure through the bonding process. In this structure, through the bonding process, a silicon oxynitride layer, a silicon nitride layer, a silicon dioxide layer, a polysilicon layer or an amorphous silicon layer which is formed on the silicon wafer by using a method such as LPCVD/PECVD is combined with a silicon wafer, a silicon dioxide wafer, a silicon oxynitride wafer, a silicon nitride wafer, a polycrystalline silicon wafer, or an amorphous silicon wafer to form a multilayer SOI structure.

2. The structure formed by the method of the present embodiment is diverse and can meet design requirements of different devices.

3. One of the innovations in the technical solution of the present embodiment is that the silicon nitride layer or the silicon oxynitride layer is used to replace the silicon dioxide layer as the insulating layer, so that the problem of serious spontaneous heating of an existing SOI device using the silicon dioxide film as the insulating buried layer is solved.

4. The method of the present embodiment also creatively uses polysilicon or amorphous silicon to replace silicon dioxide as the insulating layer material, so that the problem of a poor radio frequency characteristic of the existing SOI device using the silicon dioxide film as the insulating buried layer is solved.

5. The preparation process of the insulating layer material used in the method of the present embodiment is simple, high in process compatibility and low in cost.

6. The insulating layer material used in the method of the present embodiment has a high selectivity and can serve as a thermal corrosion and acid corrosion barrier layer.

7. The SOI material with the excellent thermal conductivity is prepared by the method of the present embodiment, so that the problems of serious spontaneous heating of an existing SOI device which uses the $SiO_2$ film as the insulating buried layer, and severe warpage of SOI caused by high-temperature annealing are solved. Meanwhile, with the introduction of the laser splitting technology, layer density defects of the device are reduced, so that the production efficiency and the product quality are improved.

In summary, the present embodiment has a predictable relatively higher economic and social value.

Embodiment 2

The content of this embodiment is basically the same as that of Embodiment 1, and the difference therebetween is as follows.

The insulating layer structure for the semiconductor product is as shown in FIG. 1. The insulating layer structure for the semiconductor product comprises a device substrate 1, a supporting substrate 2, and a thin film layer 3. The device substrate 1 and the supporting substrate 2 are silicon wafers. The thin film layer(s) 3 is/are arranged on the device substrate 1 or/and the supporting substrate 2, and is/are a silicon dioxide layer(s).

At least one intermediate layer 4 is arranged on the thin film layer 3 on at least one of the device substrate 1 and the supporting substrate 2, and is one of the followings: a silicon oxynitride layer, a silicon nitride layer, a polysilicon layer and an amorphous silicon layer.

An intermediate layer 4 is arranged on the thin film layer 3 on at least one of the device substrate 1 and the supporting substrate 2; and the device substrate 1 and the supporting substrate 2 are bonded together through the thin film layer 3 arranged on at least one of the device substrate 1 and the supporting substrate 2 and the intermediate layer 4 on the thin film layer 3 to form an integral multilayer SOI structure.

Embodiment 3

The content of this embodiment is basically the same as that of Embodiment 1, and the difference therebetween is as follows.

Figure 2:
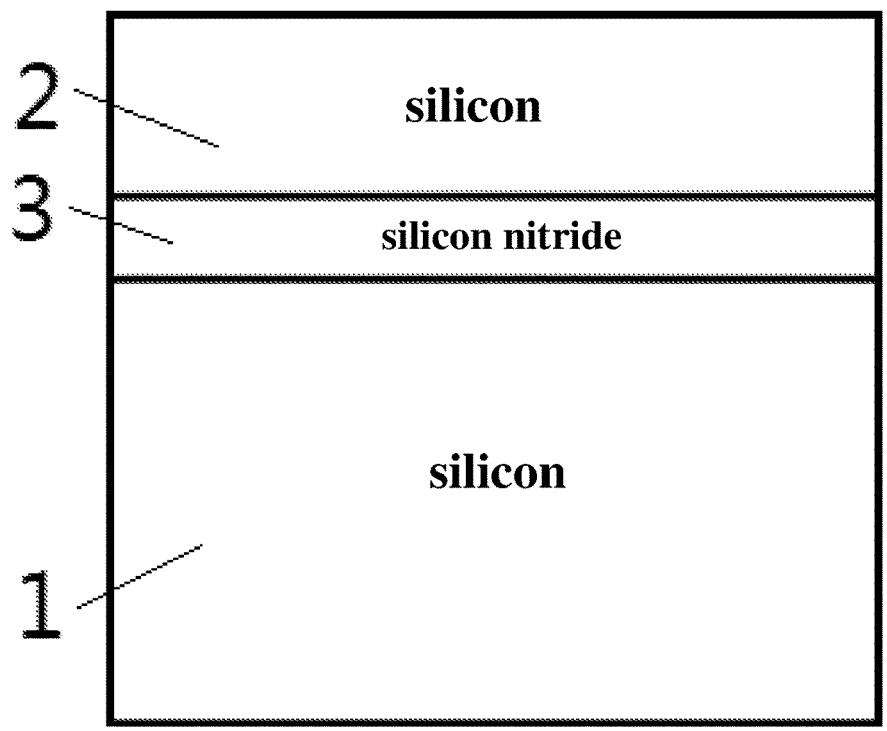
FIG. 2 is a schematic view of another insulating layer structure for the semiconductor product according to Embodiment 2.

The insulating layer structure for the semiconductor product is as shown in FIG. 2. The insulating layer structure for the semiconductor product comprises a device substrate 1, a supporting substrate 2, and a thin film layer 3. The device substrate 1 and the supporting substrate 2 are silicon wafers. The thin film layer(s) 3 is/are arranged on the device substrate 1 or/and the supporting substrate 2, and is/are a silicon nitride layer(s). The device substrate 1 and the supporting substrate 2 are bonded together through the thin film layer 3 arranged on at least one of the device substrate 1 and the supporting substrate 2 to form an integral multilayer SOI (Silicon On Insulator) structure.

Embodiment 4

The content of this embodiment is basically the same as that of Embodiment 1, and the difference therebetween is as follows.

Figure 3:
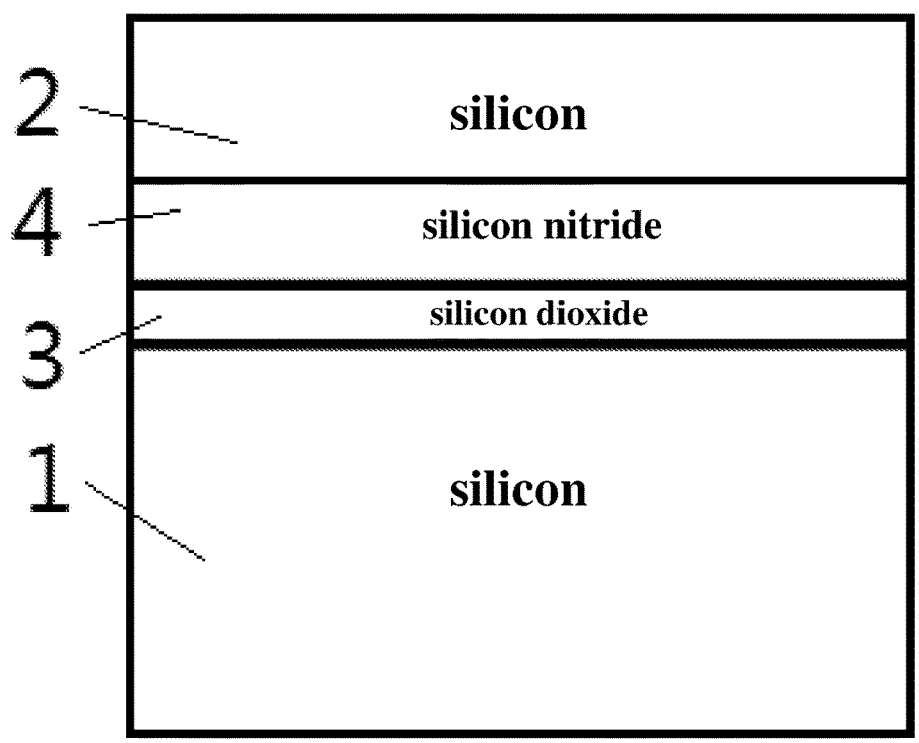
FIG. 3 is a schematic view of yet another insulating layer structure for the semiconductor product according to Embodiment 3.

The insulating layer structure for the semiconductor product is as shown in FIG. 3. The insulating layer structure for the semiconductor product comprises a device substrate 1, a supporting substrate 2, and a thin film layer 3. The device substrate 1 and the supporting substrate 2 are silicon wafers. The thin film layer 3 is arranged on the device substrate 1, and is a silicon dioxide layer.

At least one intermediate layer 4 is arranged on the thin film layer 3 on at least one of the device substrate 1 and the supporting substrate 2, and is a silicon nitride layer.

An intermediate layer 4 is arranged on the thin film layer 3 on at least one of the device substrate 1 and the supporting substrate 2; and the device substrate 1 and the supporting substrate 2 are bonded together through the thin film layer 3 arranged on at least one of the device substrate 1 and the supporting substrate 2 and the intermediate layer 4 on the thin film layer 3 to form an integral multilayer SOI structure.

Embodiment 5

The content of this embodiment is basically the same as that of Embodiment 1, and the difference therebetween is as follows.

Figure 4:
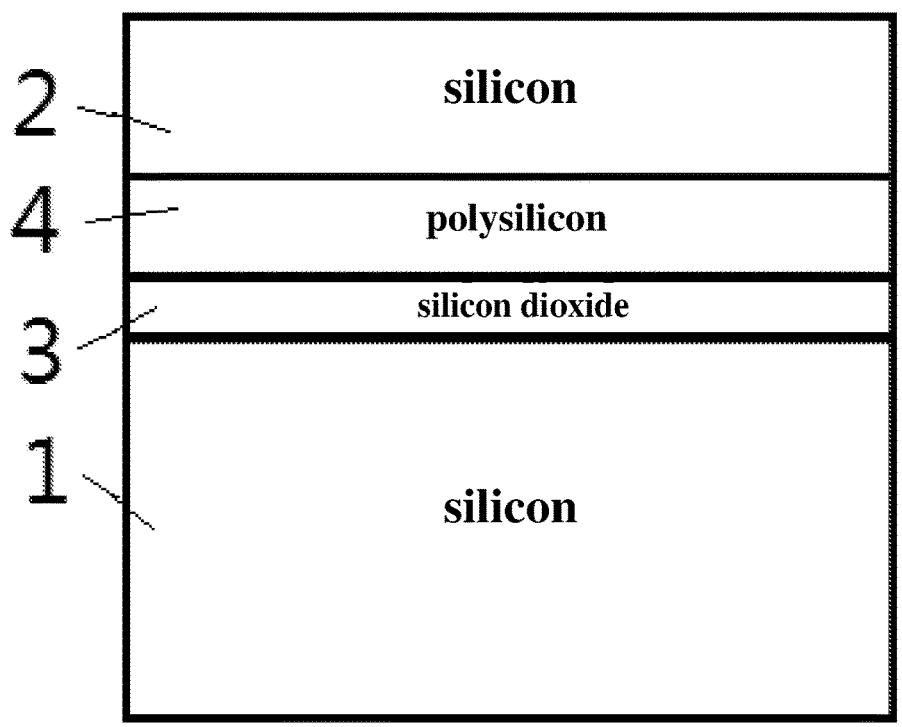
FIG. 4 is a schematic view of yet another insulating layer structure for the semiconductor product according to Embodiment 4.

The insulating layer structure for the semiconductor product is as shown in FIG. 4. The insulating layer structure for the semiconductor product comprises a device substrate 1, a supporting substrate 2, and a thin film layer 3. The device substrate 1 and the supporting substrate 2 are silicon wafers. The thin film layer 3 is arranged on the device substrate 1, and is a silicon dioxide layer.

At least one intermediate layer 4 is arranged on the thin film layer 3 on at least one of the device substrate 1 and the supporting substrate 2, and is a polysilicon layer.

An intermediate layer 4 is arranged on the thin film layer 3 on at least one of the device substrate 1 and the supporting substrate 2; and the device substrate 1 and the supporting substrate 2 are bonded together through the thin film layer 3 arranged on at least one of the device substrate 1 and the supporting substrate 2 and the intermediate layer 4 on the thin film layer 3 to form an integral multilayer SOI structure.

Embodiment 6

The content of this embodiment is basically the same as that of Embodiment 1, and the difference therebetween is as follows.

Figure 5:
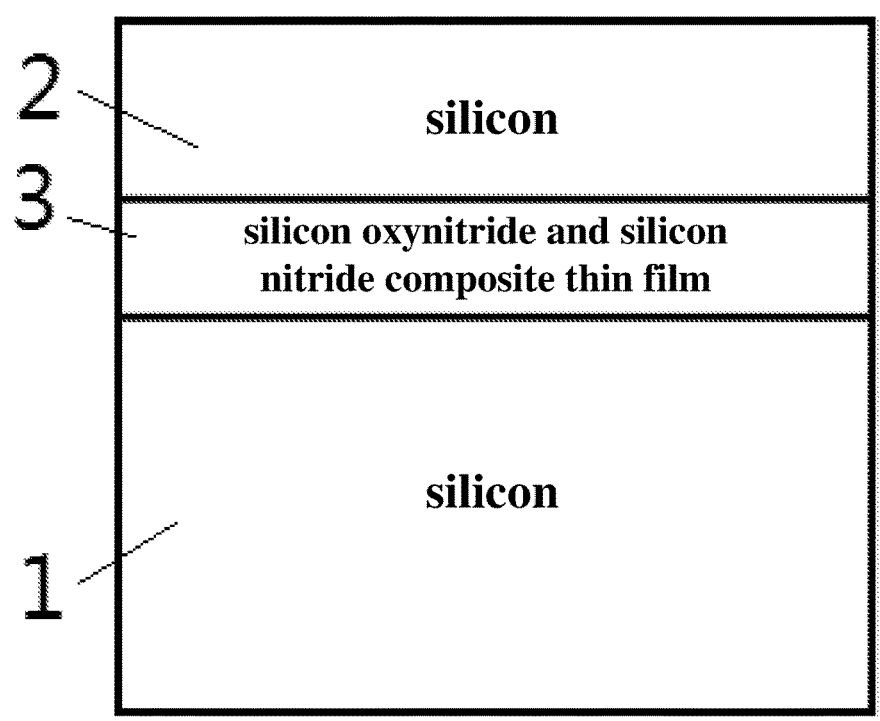
FIG. 5 is a schematic view of yet another insulating layer structure for the semiconductor product according to Embodiment 5.

The insulating layer structure for the semiconductor product is as shown in FIG. 5. The insulating layer structure for the semiconductor product comprises a device substrate 1, a supporting substrate 2, and a thin film layer 3. The device substrate 1 and the supporting substrate 2 are silicon wafers. The thin film layer 3 is arranged on the device substrate 1, and is a silicon oxynitride and silicon nitride composite thin film layer.

The device substrate 1 and the supporting substrate 2 are bonded together through the thin film layer 3 arranged on at least one of the device substrate 1 and the supporting substrate 2 to form an integral multilayer SOI (Silicon On Insulator) structure.

The invention claimed is:

1. An insulating layer structure for a semiconductor product, the insulating layer structure comprising: a device substrate, a supporting substrate and at least one thin film layer, wherein the device substrate and the supporting substrate are silicon wafers; at least one thin film layer is arranged on the device substrate or/and the supporting substrate, and the at least one thin film layer includes a silicon dioxide layer, a silicon oxynitride layer, a silicon nitride layer, a polysilicon layer and an amorphous silicon layer; and wherein the device substrate and the supporting substrate are bonded together through the thin film layer arranged on at least one of the device substrate and the supporting substrate to form an integral multilayer SOI structure.

2. The insulating layer structure for the semiconductor product of claim 1, wherein at least one intermediate layer is arranged on the thin film layer on at least one of the device substrate and the supporting substrate, and is one or a combination of: the silicon dioxide layer, the silicon oxynitride layer, the silicon nitride layer, the polysilicon layer and the amorphous silicon layer; or wherein an intermediate layer is arranged on the thin film layer on at least one of the device substrate and the supporting substrate; and the device substrate and the supporting substrate are bonded together through the thin film layer arranged on at least one of the device substrate and the supporting substrate and the intermediate layer on the thin film layer to form an integral multilayer SOT structure.

3. The insulating layer structure for the semiconductor product of claim 1, wherein the insulating layer structure meets one or a combination of the following requirements:

the resistivity of a silicon wafer used as the device substrate or/and the supporting substrate is 0.1-10000 ohm·cm;

when the thin film layer or an intermediate layer is a silicon dioxide layer, the thickness of the silicon dioxide layer is 0-5 μm, a single layer thickness of following layer structures, comprising the silicon oxynitride layer, the silicon nitride layer, the polysilicon layer and the amorphous silicon layer, as the thin film layer or the intermediate layer is 0.01-10 μm;

the diameter of the silicon wafer is 150 mm, or 200 mm, or 300 mm; and the thin film layer(s) arranged on the device substrate or/and the supporting substrate and the intermediate layer(s) on the thin film layer(s) are bonded together to form the integral multilayer SOI structure.

4. A preparation method of an insulating layer structure for a semiconductor product, comprising:

preparing a device substrate and a supporting substrate of the insulating layer structure for the semiconductor product, and preparing a thin film layer on at least one of plurality of surfaces of the device substrate and the supporting substrate, wherein the device substrate and the supporting substrate are silicon wafers, the thin film layer is arranged on the device substrate or/and the supporting substrate, and is one of a silicon dioxide layer, a silicon oxynitride layer, a silicon nitride layer, a polysilicon layer and an amorphous silicon layer; and bonding the device substrate and the supporting substrate through the thin film layer arranged on at least one of the device substrate and the supporting substrate to form an integral multilayer SOI structure.

5. The preparation method of the insulating layer structure for the semiconductor product of claim 4, wherein before bonding, at least one intermediate layer is pre-arranged on the thin film layer on at least one of the device substrate and the supporting substrate, and is one or a combination of the following: the silicon dioxide layer, the silicon oxynitride layer, the silicon nitride layer, the polysilicon layer and the amorphous silicon layer; and the bonding meets the following requirements: the thin film layer and the intermediate layer are sequentially arranged on a base body of at least one of the device substrate and the supporting substrate before bonding, and the other one of the device substrate and the supporting substrate to be bonded is a base body without the thin film layer and the intermediate layer, or a base body only provided with the thin film layer, or a base body sequentially provided with the thin film layer and the intermediate layer.

6. The preparation method of the insulating layer structure for the semiconductor product of claim 4, wherein the selected device substrate and supporting substrate before bonding are silicon wafers with the resistivity of 0.1-10000 ohm·cm;

when the thin film layer is the silicon dioxide layer, the thickness of the silicon dioxide layer is 0-5 μm;

when at least one intermediate layer is arranged on the thin film layer(s) on the device substrate or/and the supporting substrate, the single layer thickness of the intermediate layer is 0.01-10 μm; and the single intermediate layer is one of the silicon oxynitride layer, the silicon nitride layer, the polysilicon layer and the amorphous silicon layer.

7. The preparation method of the insulating layer structure for the semiconductor product of claim 6, wherein the diameter of the silicon wafer is 150 mm, or 200 mm, or 300 mm; and the thin film layer(s) on the device substrate and the supporting substrate and the intermediate layer(s) on the thin film layer(s) are bonded together to form the integral multilayer SOI structure.

8. The preparation method of the insulating layer structure for the semiconductor product of claim 7, further comprising:

selecting a silicon wafer with any crystal phase, any conductivity type, a diameter of 150 mm, or 200 mm or 300 mm, and a resistivity of 0.1-10000 ohm·cm as the device substrate and the supporting substrate;

ultrasonically cleaning the device substrate and the supporting substrate successively by using a mixed solution of HF, $H_2SO_4$ and $H_2O_2$ and deionized water to remove a natural oxide layer and contaminants on the surfaces of the device substrate and the supporting substrate to obtain the silicon wafers with high-quality surfaces, spin-drying the device substrate and the supporting substrate after the completion of cleaning, and placing the device substrate and/or the supporting substrate to be grown with a thin film layer into a reaction chamber of a PECVD or LPCVD apparatus;

performing plasma in-situ cleaning on the device substrate and/or the supporting substrate with a hydrogen flow rate of 20-200 sccm and a cleaning time of 5-20 min;

depositing the thin film layer on a base body of at least one of the device substrate and the supporting substrate, wherein according to different materials of the thin film layers, gases used in deposition are oxygen, hydrogen, nitrogen, silane, nitrous oxide, hydrogen and argon with flow rates of 0-20 slm, 0-10 slm, 0-1 slm, 0-25 sccm, 0-20 sccm, 0-50 sccm and 0-60 sccm respectively, a deposition pressure is 0-10 Pa, the deposition thickness of a silicon dioxide layer as the thin film layer is 0-5 μm, and a deposition thickness of a silicon oxynitride layer, a silicon nitride layer, a polysilicon layer or an amorphous silicon layer as the thin film layer is 0-10 μm;

performing plasma in-situ cleaning on the device substrate and/or the supporting substrate with a hydrogen flow rate of 20-200 sccm and a cleaning time of 5-20 min;

depositing an intermediate layer on the surface of the thin film layer on the device substrate and/or the supporting substrate, wherein according to different materials of the intermediate layer, gases used in deposition are silane, nitrous oxide, hydrogen, argon and ammonia with the flow rates of 5-25 sccm, 2-20 sccm, 10-50 sccm, 30-60 sccm and 5-20 sccm respectively, a deposition pressure is 5-10 Pa, and the deposition thickness is 0.01-10 μm;

performing hydrogen plasma etching after the intermediate layer as the thin film layer is deposited with a hydrogen flow rate of 30-120 sccm and an etching time of 0.5-10 min;

depositing another intermediate layer on the surface of the single intermediate layer prepared in the above steps, and repeating this step for n (n≥0) times till the total deposition thickness meets a requirement; and processing the device substrate and/or the supporting substrate processed by the above steps through a manner I or II to obtain an SOI material with a special insulating buried layer, wherein manner I comprises: performing low-temperature vacuum bonding on the device substrate and the supporting substrate, and grinding and polishing a bonded sheet obtained in the above step to obtain the SOI material having a top silicon thickness of 1.5-250 μm;

manner II comprises: injecting hydrogen ions into the device substrate with an injection depth of 100-1500 nm, performing low-temperature vacuum bonding on the device substrate and the supporting substrate to obtain a bonded sheet, performing low-temperature annealing process on the bonded sheet with an annealing temperature of 150-300° C., performing microwave splitting or laser splitting on the bonded sheet to form an SOI structure material, and performing CMP process on the SOI structure to form the SOI material having a top layer thickness of 0.02-1.5 μm;

the microwave splitting has the following requirements: a microwave power is 1-4 KW, a microwave time is 2-5 min, and a microwave temperature is 70-400° C.; and the laser splitting has the following requirements: an infrared laser is adopted, a laser spot size is 0.5-2 mm, a laser power is 100 mw-100 w, a heating time is 10-30 s, a laser scanning path is along the diameter direction of the silicon wafer, the scanning number of the silicon wafer is 8-28 times, a laser beam scans the silicon wafer at an incident angle of 45°-135°, and the surface temperature of the silicon wafer increases quickly through laser heating to enable hydrogen ions in the silicon wafer to accumulate to achieve the purpose of splitting.

9. The preparation method of the insulating layer structure for the semiconductor product of claim 8, wherein the preparation method meets one or a combination of the following requirements:

in the process of depositing the intermediate layer, a hydrogen plasma etching step is added, so that a weak Si—N bond is broken while filling a silicon dangling bond through an etching effect of hydrogen plasma, and a new stable Si—N bond is re-formed; and a surface activity of the thin film is increased and nucleation energy is reduced to prepare a high-quality silicon nitride film as the intermediate layer; and an SOI warpage change caused by the difference in thermal expansion coefficients after high-temperature annealing is reduced by adjusting thicknesses of the silicon oxynitride film and the silicon nitride film in the intermediate layer.

10. The preparation method of the insulating layer structure for the semiconductor product of claim 8, wherein in the laser splitting process, the laser acts on the surface of the silicon wafer to heat the surface of the silicon wafer, so that injected H+ is accumulated into gas molecules which are filled in cracks subsequently to form micro hydrogen bubbles; and with the continuous accumulation of the hydrogen molecules, a hydrogen layer is finally peeled off to achieve the purpose of splitting, and thus an SOI structure is formed.

* * * * *